(12) United States Patent
Egbe et al.

(10) Patent No.: US 8,030,263 B2
(45) Date of Patent: Oct. 4, 2011

(54) COMPOSITION FOR STRIPPING AND CLEANING AND USE THEREOF

(75) Inventors: Matthew I. Egbe, West Norriton, PA (US); Michael Walter Legenza, Bellingham, MA (US); Thomas Michael Wieder, Emmaus, PA (US); Jennifer May Rieker, Whitehall, PA (US)

(73) Assignee: Air Products and Chemicals, Inc., Allentown, PA (US)

( * ) Notice: Subject to any disclaimer, the term of this patent is extended or adjusted under 35 U.S.C. 154(b) by 714 days.

(21) Appl. No.: 11/155,654

(22) Filed: Jun. 20, 2005

(65) Prior Publication Data

US 2006/0014656 A1 Jan. 19, 2006

Related U.S. Application Data

(60) Provisional application No. 60/584,733, filed on Jul. 1, 2004.

(51) Int. Cl.
C11D 7/50 (2006.01)
(52) U.S. Cl. .......................... 510/175; 510/176; 134/1.3
(58) Field of Classification Search .................. 510/175, 510/176; 134/1.3
See application file for complete search history.

(56) References Cited

U.S. PATENT DOCUMENTS

| | | | |
|---|---|---|---|
| 5,444,023 A | 8/1995 | Homma | |
| 5,529,887 A | 6/1996 | Horn et al. | |
| 5,563,119 A | 10/1996 | Ward | |
| 5,792,274 A | 8/1998 | Tanabe et al. | |
| 6,117,364 A | 9/2000 | Vorderbruggen et al. | |
| 6,372,410 B1* | 4/2002 | Ikemoto et al. | 430/318 |
| 6,417,112 B1 | 7/2002 | Peyne et al. | |
| 6,472,357 B2 | 10/2002 | Takashima | |
| 6,531,436 B1 | 3/2003 | Sahbari et al. | |
| 6,554,912 B2* | 4/2003 | Sahbari | 134/26 |
| 6,677,286 B1 | 1/2004 | Rovito et al. | |
| 6,869,921 B2 | 3/2005 | Koito et al. | |
| 7,129,029 B2* | 10/2006 | Egbe | 430/329 |
| 7,166,419 B2* | 1/2007 | Egbe | 430/329 |
| 7,361,631 B2* | 4/2008 | Egbe et al. | 510/175 |
| 7,674,755 B2* | 3/2010 | Egbe et al. | 510/175 |
| 7,687,447 B2* | 3/2010 | Egbe et al. | 510/175 |
| 2002/0013239 A1* | 1/2002 | Sahbari | 510/175 |
| 2002/0128164 A1 | 9/2002 | Hara et al. | |
| 2003/0068699 A1 | 4/2003 | Baker et al. | |
| 2003/0114014 A1* | 6/2003 | Yokoi et al. | 438/745 |
| 2003/0130147 A1 | 7/2003 | Koito et al. | |
| 2003/0138737 A1 | 7/2003 | Wakiya et al. | |
| 2003/0148910 A1 | 8/2003 | Peters et al. | |
| 2003/0181342 A1 | 9/2003 | Seijo et al. | |
| 2003/0181344 A1* | 9/2003 | Ikemoto et al. | 510/175 |
| 2004/0009883 A1* | 1/2004 | Ikemoto et al. | 510/175 |
| 2004/0038154 A1 | 2/2004 | Muramatsu et al. | |
| 2004/0063042 A1* | 4/2004 | Egbe | 430/329 |
| 2004/0106531 A1 | 6/2004 | Kanno et al. | |
| 2004/0220066 A1* | 11/2004 | Rutter, Jr. | 510/175 |
| 2004/0266637 A1 | 12/2004 | Rovito et al. | |
| 2005/0014667 A1* | 1/2005 | Aoyama et al. | 510/175 |
| 2005/0019868 A1 | 1/2005 | Wakiya et al. | |
| 2005/0084792 A1 | 4/2005 | Yokoi et al. | |
| 2005/0106492 A1 | 5/2005 | Yokoi et al. | |
| 2005/0119143 A1 | 6/2005 | Egbe et al. | |
| 2006/0003910 A1* | 1/2006 | Hsu et al. | 510/176 |
| 2006/0014656 A1* | 1/2006 | Egbe et al. | 510/175 |
| 2006/0016785 A1* | 1/2006 | Egbe et al. | 216/83 |
| 2006/0205622 A1* | 9/2006 | Egbe | 510/170 |
| 2006/0293208 A1* | 12/2006 | Egbe et al. | 510/407 |
| 2007/0037087 A1* | 2/2007 | Yokoi et al. | 430/256 |
| 2007/0149430 A1* | 6/2007 | Egbe et al. | 510/175 |
| 2007/0272275 A1* | 11/2007 | Wu et al. | 134/19 |
| 2009/0233827 A1* | 9/2009 | Egbe et al. | 510/176 |

FOREIGN PATENT DOCUMENTS

| | | |
|---|---|---|
| EP | 1091254 A1 | 4/2004 |
| EP | 1138726 B1 | 1/2005 |
| EP | 1619557 A1 | 1/2006 |
| JP | 200368699 A | 3/2003 |
| WO | 2004/009730 A1 | 1/2004 |
| WO | 2004/019134 A1 | 3/2004 |
| WO | 2004/094581 A1 | 11/2004 |
| WO | 2006/093770 A1 | 9/2006 |

OTHER PUBLICATIONS

Polewska, et al., "In Situ STM Study of Cu(111) Surface Structure and Corrosion in Pure and Benzotriazole-Containing Sulfuric Acid Solution", J. Phys. Chem. B 1999, 103, 10440-10451.
Szocs, et al., "Electrochemical Behaviour of an Inhibitor film Formed on Copper Surface", Corrosion Science, 47 (2005) 893-908.
Feng, et al., "Corrosion Protection of Copper by a Self-Assembled Monolayer of Alkanethiol", J. Electrochem. Soc., vol. 144, No. 1, Jan. 1997, pp. 55-64.
Laibinis, et al., "Self-Assembled Monolayers of n-Alkanethiolates on Copper Are Barrier Films That Protect the Metal Against Oxidation by Air", J. Am. Chem. Soc. 1992, 114, 9022-9028.
Huang, et al., "Dissolution of Copper Thin Films in Hydroxylamine-Based Solutions", Int. J. Miner. Process., 72 (2003) 365-372.

* cited by examiner

*Primary Examiner* — Gregory E Webb
(74) *Attorney, Agent, or Firm* — Rosaleen P. Morris-Oskanian; Anne B. Kiernan

(57) ABSTRACT

A composition comprising one or more water soluble organic solvents comprising a glycol ether; water; a fluoride containing compound provided that if the fluoride containing compound is ammonium fluoride than no additional fluoride containing compound is added to the composition; optionally a quaternary ammonium compound; and optionally a corrosion inhibitor is disclosed herein that is capable of removing residues from an article such as photoresist and/or etching residue. Also disclosed herein is a method for removing residues from an article using the composition disclosed herein.

21 Claims, No Drawings

COMPOSITION FOR STRIPPING AND CLEANING AND USE THEREOF

CROSS-REFERENCE TO RELATED APPLICATIONS

This application claims the benefit of U.S. Provisional Application No. 60/584,733, filed 1 Jul. 2004.

BACKGROUND

Numerous steps are involved in the fabrication of microelectronic structures. Within the manufacturing scheme of fabricating integrated circuits, selective etching of different surfaces of the semiconductor is sometimes required. Historically, a number of vastly different types of etching processes, to selectively remove material, have been successfully utilized to varying degrees. Moreover, the selective etching of different layers, within the microelectronic structure, is considered a critical and crucial step in the integrated circuit fabrication process.

Increasingly, reactive ion etching (RIE) is the process of choice for pattern transfer during via, metal line and trench formation. For instance, complex semiconductor devices such as advanced DRAMS and microprocessors, which require multiple layers of back end of line interconnect wiring, utilize RIE to produce vias, metal lines and trench structures. Vias are used, through the interlayer dielectric, to provide contact between one level of silicon, silicide or metal wiring and the next level of wiring. Metal lines are conductive structures used as device interconnects. Trench structures are used in the formation of metal line structures. Vias, metal lines and trench structures typically expose metals and alloys such as Al, Al/Cu, Cu, Ti, TiN, Ta, TaN, W, TiW, silicon or a silicide such as a silicide of tungsten, titanium or cobalt. The RIE process typically leaves a residue (of a complex mixture) that may include re-sputtered oxide material as well as possibly organic materials from photoresist and antireflective coating materials used to lithographically define the vias, metal lines and or trench structures.

It would therefore be desirable to provide a selective cleaning composition and process capable of removing residues such as, for example, remaining photoresist and/or processing residues, such as for example, residues resulting from selective etching using plasmas and/or RIE. Moreover, it would be desirable to provide a selective cleaning composition and process, capable of removing residues such as photoresist and etching residue, that exhibits high selectivity for the residue as compared to metals, high k dielectric materials, silicon, silicide and/or interlevel dielectric materials including low k dielectric materials such as deposited oxides that might also be exposed to the cleaning composition. It would be desirable to provide a composition that is compatible with and can be used with such sensitive low-k films as HSQ, MSQ, FOx, black diamond and TEOS (tetraethylsilicate).

BRIEF SUMMARY OF THE INVENTION

The composition disclosed herein is capable of selectively removing residue such as photoresist and processing residue from a substrate without attacking to any undesired extent metal, low k, and/or high k dielectric materials that might also be exposed to the composition. In addition, the composition disclosed herein may exhibit minimal etch rates of certain dielectric materials such as silicon oxide.

Also disclosed herein is a method for removing residues including photoresist and/or etching residue from a substrate that comprises contacting the substrate with the composition disclosed herein.

DETAILED DESCRIPTION OF THE INVENTION

A composition and method comprising same for selectively removing residues such as, for example, photoresist and/or processing residues such as the residues generated by etching, particularly reactive ion etching. In a cleaning method involving substrates useful for microelectronic devices, typical contaminants to be removed may include, for example, organic compounds such as exposed and/or ashed photoresist material, ashed photoresist residue, UV- or X-ray-hardened photoresist, C—F-containing polymers, low and high molecular weight polymers, and other organic etch residues; inorganic compounds such as metal oxides, ceramic particles from chemical mechanical planarization (CMP) slurries and other inorganic etch residues; metal containing compounds such as organometallic residues and metal organic compounds; ionic and neutral, light and heavy inorganic (metal) species, moisture, and insoluble materials, including particles generated by processing such as planarization and etching processes. In one particular embodiment, residues removed are processing residues such as those created by reactive ion etching.

The residues are typically present in a substrate that also includes metal, silicon, silicate and/or interlevel dielectric materials such as, for example, deposited silicon oxides and derivatized silicon oxides such as HSQ, MSQ, FOX, TEOS and spin-on glass, chemical vapor deposited dielectric materials, and/or high-k materials such as hafnium silicate, hafnium oxide, barium strontium titanate (BST), $TiO_2$, $TaO_5$, wherein both the residues and the metal, silicon, silicide, interlevel dielectric materials, low-k and/or high-k materials will come in contact with the cleaning composition. The composition and method disclosed herein provide for selectively removing the residues such as photoresist, BARC, gap fill, and/or processing residues without significantly attacking the metal, silicon, silicon dioxide, interlevel dielectric materials, low-k and/or high-k materials. In certain embodiments, the substrate may contain a metal, such as, but not limited to, aluminum, aluminum copper alloy, copper, copper alloy, titanium, titanium nitride, tantalum, tantalum nitride, tungsten, and/or titanium/tungsten alloys. In one embodiment, the composition disclosed herein may be suitable for substrates containing sensitive low-k-films.

The compositions disclosed herein may comprise from 5 to 95% by weight or from 10 to 80% by weight of a water soluble organic solvent. In one embodiment, the composition may contain a major amount of one or more water soluble organic solvent (i.e., 50% by weight or greater) and a minor amount of water (i.e., less than 50% by weight). In an alternative embodiment, the composition may contain a major amount of water (i.e., 50% by weight or greater) and a minor amount of one or more water soluble organic solvent (i.e., less than 50% by weight).

The water soluble organic solvent includes organic amines, amides, sulfoxides, sulfones, lactams, imidazolidinones, lactones, polyhydric alcohols, glycol ethers, glycols, and the like. The organic solvents are typically miscible in water are commonly used in formulations for stripping and cleaning applications. Examples of organic amines include monoethanolamine (MEA), N-methylethanolamine (NMEA), ethylenediamine, 2-(2-aminoetylamino)ethanol, diethanolamine, dipropylamine, 2-ethylaminoethanol, dimethylaminoethanol, cyclohexylamine, benzylamine, pyrrole, pyrrolidine, pyridine, morpholine, piperidine, oxazole and the like. Examples of amides includes N,N-dimethylformamide, dimethylacetamide (DMAC), diethylacetamide and the like. Examples of sulfoxides include dimethyl sulfoxide. Examples of sulfones include dimethyl sulfone and diethyl sulfone. Examples of lactams include N-methyl-2-pyrrolidone and imidazolidinone. Examples of lactones include butyrolactone and valerolactone. Examples of polyhydric alcohols include ethylene glycol, propylene glycol, and glycerol. Still further examples of organic solvents include, but are not limited to, N-methylpyrrolidinone (NMP), dimethylformamide, N-methylformamide, formamide, dimethyl-2-piperidone (DMPD), tetrahydrofurfuryl alcohol, or multifunctional compounds, such as hydroxyamides or amino alcohols. The organic solvents enumerated above may be used alone or in combination with two or more solvents.

In certain embodiments, the water soluble organic solvent may be a glycol ether. The glycol ethers are may include glycol mono($C_1$-$C_6$)alkyl ethers and glycol di($C_1$-$C_6$)alkyl ethers, such as but not limited to, ($C_1$-$C_{20}$)alkane diols, ($C_1$-$C_6$)alkyl ethers, and ($C_1$-$C_{20}$)alkane diol di($C_1$-$C_6$)alkyl ethers. Examples of glycol ethers are ethylene glycol monomethyl ether, ethylene glycol monoethyl ether, ethylene glycol monobutyl ether, ethylene glycol dimethyl ether, ethylene glycol diethyl ether, diethylene glycol monomethyl ether, diethylene glycol monoethyl ether, diethylene glycol monopropyl ether, diethylene glycol monoisopropyl ether, diethylene glycol monobutyl ether, diethylene glycol monoisobutyl ether, diethylene glycol monobenzyl ether, diethylene glycol dimethyl ether, diethylene glycol diethyl ether, triethylene glycol monomethyl ether, triethylene glycol dimethyl ether, polyethylene glycol monomethyl ether, diethylene glycol methyl ethyl ether, triethylene glycol ethylene glycol monomethyl ether acetate, ethylene glycol monethyl ether acetate, ethylene glycol monomethyl ether acetate, dipropylene glycol methyl ether, tripropylene glycol methyl ether, propylene glycol monomethyl ether, propylene glycol dimethyl ether, propylene glycol monobutyl ether, propylene glycol, monoproply ether, dipropylene glycol monomethyl ether, dipropylene glycol monopropyl ether, dipropylene glycol monoisopropyl ether, dipropylene monobutyl ether, diproplylene glycol diisopropyl ether, tripropylene glycol monomethyl ether, 1-methoxy-2-butanol, 2-methoxy-1-butanol, 2-methoxy-2-methylbutanol, 1,1-dimethoxyethane and 2-(2-butoxyethoxy)ethanol. More typical examples of glycol ethers are propylene glycol monomethyl ether, propylene glycol monopropyl ether, tri(propylene glycol) monomethyl ether and 2-(2-butoxyethoxy)ethanol.

The composition may contain from 5 to 95% by weight or from 10 to 80% by weight of a water. It can be present incidentally as a component of other elements, such as for example, an aqueous solution comprising the fluoride containing compound, or it can be added separately. Some non-limiting examples of water include deionized water, ultra pure water, distilled water, doubly distilled water, or deionized water having a low metal content.

In certain embodiments, the composition may include a fluoride containing compound. The fluoride containing compound or mixture thereof is present in amounts of from 0.1% to 20%, or from 0.1 to 10%, or from greater than 0.8 to 10% by weight based on the total weight of the composition. Fluoride containing compounds may include those of the general formula $R_1R_2R_3R_4NF$ where $R_1$, $R_2$, $R_3$, and $R_4$ are each independently hydrogen, an alcohol group, an alkoxy group, an alkyl group and mixtures thereof. Examples of such compounds include ammonium fluoride, tetramethyl ammonium fluoride, tetraethyl ammonium fluoride, tetrabutyl ammonium fluoride, and mixtures thereof. Still further examples of containing compound include fluoroboric acid, hydrofluoric acid, fluoroborates, fluoroboric acid, tetrabutylammonium tetrafluoroborate, aluminum hexafluoride, and choline fluoride. In still further embodiments, the containing compound is a fluoride salt of an aliphatic primary, secondary or tertiary amine can be used. In embodiments wherein the fluoride containing compound is ammonium fluoride, the composition does not include any additional fluoride containing compounds.

In certain embodiments, the composition may include one or more quaternary ammonium compound. The composition also includes one or more quaternary ammonium compound having the formula $[N—R_5R_6R_7R_8]^+OH^-$ wherein $R_5$, $R_6$, $R_7$, and $R_8$ are each independently an alkyl group of 1 to 20 carbon atoms. The term "alkyl" refers to straight or branched chain unsubstantiated hydrocarbon groups of 1 to 20 carbon atoms, or from 1 to 8 carbon atoms, or from 1 to 4 carbon atoms. Examples of suitable alkyl groups include methyl, ethyl, propyl, isopropyl, butyl, and tertbutyl. The expression "lower alkyl" refers to alkyl groups of 1 to 4 carbon atoms. Examples of suitable quaternary ammonium compounds include tetramethylammounium hydroxide (TMAH), tetraethylammonium hydroxide, tetrabutylammonium hydroxide (TBAH), tetrapropylammonium hydroxide, trimethylethylammonium hydroxide, (2-hydroxyethyl)trimethylammonium hydroxide, (2-hydroxyethyl)triethylammonium hydroxide, (2-hydroxyethyl)tripropylammonium hydroxide, (1-hydroxypropyl)trimethylammonium hydroxide, ethyltrimethylammonium hydroxide, diethyldimethylammonium hydroxide and benzyltrimethylammonium hydroxide. The quaternary ammonium compounds are present in an amount ranging from about 0.1 to 15% or about 0.1 to 10% by weight.

In certain embodiments, the compositions described herein can also optionally contain up to about 20% by weight, or about 0.2 to about 19% by weight of a corrosion inhibitor. Any corrosion inhibitor known in the art for similar applications, such as those disclosed in U.S. Pat. No. 5,417,877 which are incorporated herein by reference may be used. Corrosion inhibitors may be, for example, an organic acid, an organic acid salt, a phenol, a triazole, a hydroxylamine or add salt thereof. Examples of particular corrosion inhibitors include anthranilic acid, gallic acid, benzoic acid, isophthalic acid, maleic acid, fumaric acid, D,L-malic acid, malonic acid, phthalic acid, maleic anhydride, phthalic anhydride, benzotriazole (BZT), carboxybenzotriazole, resorcinol, carboxybenzotriazole, diethyl hydroxylamine and the lactic acid and citric acid salts thereof, and the like. Further examples of corrosion inhibitors that may be used include catechol, resorcinol, pyrogallol, and esters of gallic acid. Particular hydroxylamines that can be used include diethylhydroxylamine and the lactic acid and citric acid salts thereof. Yet other examples of suitable corrosion inhibitors include fructose, ammonium thiosulfate, glycine, lactic acid, tetramethylguanidine, iminodiacetic acid, and dimethylacetoacetamide.

The composition may also include one or more of the following additives provided that these additives do not adversely effect the stripping and cleaning performance of the composition nor damage the underlying substrate surface: surfactants, chelating agents, chemical modifiers, dyes, biocides, and/or other additives in amounts up to a total of 5% by weight based on the total weight of the composition. Some examples of representative additives include acetylenic alcohols and derivatives thereof, acetylenic diols (non-ionic alkoxylated and/or self-emulsifiable acetylenic diol surfactants) and derivatives thereof, alcohols, quaternary amines and di-amines, amides (including aprotic solvents such as dimethyl formamide and dimethyl acetamide), alkyl alkanolamines (such as diethanolethylamine), and chelating agents such as beta-diketones, beta-ketoimines, carboxylic acids, mallic acid and tartaric acid based esters and diesters and derivatives thereof, and tertiary amines, diamines and tri-amines.

In certain embodiments such as when the composition comprises greater than 50% water, the compositions disclosed herein may have a pH that ranges from about 7 to about 14, or from about 9 to about 13. In alternative embodiments such as when the composition comprises less than 50% water, the compositions disclosed herein may have a pH that ranges from about 4 to about 9, or from about 5 to about 7.

The compositions disclosed herein are compatible with low-k films such as HSQ (FOx), MSQ, SiLK, etc. The formulations are also effective in stripping photoresists and plasma etch residues such as organic residues, organometallic residues, inorganic residues, metallic oxides, or photoresist complexes at low temperatures with minimal to no corrosion of aluminum, copper, titanium containing substrates. Moreover, the compositions are compatible with a variety of low dielectric and high dielectric constant materials.

During the manufacturing process, a photoresist layer is coated on the substrate. Using photolithographic process, a pattern is defined on the photoresist layer. The patterned photoresist layer is thus subjected to plasma etch by which the pattern is transferred to the substrate. Etch residues are generated in the etch stage. Some of the substrates used in this invention are ashed while some are not ashed. When the substrates are ashed, the main residues to be cleaned are etchant residues. If the substrates are not ashed, then the main residues to be cleaned or stripped are both etch residues and photoresists.

The method described herein may be conducted by contacting a substrate having a metal, organic or metal-organic polymer, inorganic salt, oxide, hydroxide, or complex or combination thereof present as a film or residue, with the described composition. The actual conditions, e.g. temperature, time, etc. depend on the nature and the thickness of the material to be removed. In general, the substrate is contacted or dipped into a vessel containing the composition at a temperature ranging from 20° C. to 85° C., or from 20° C. to 60° C., or from 20° C. and 40° C. Typical time periods for exposure of the substrate to the composition may range from, for example, 0.1 to 60 minutes, or 1 to 30 minutes, or 1 to 15 minutes. After contact with the composition, the substrate may be rinsed and then dried. Drying is typically carried out under an inert atmosphere. In certain embodiments, a deionized water rinse or rinse containing deionized water with other additives may be employed before, during, and/or after contacting the substrate with the composition described herein. However, the composition can be used in any method known in the art that utilizes a cleaning fluid for the removal of photoresist, ash or etch residues and/or residues.

EXAMPLES

The following examples are provided to further illustrate the composition and method disclosed herein. Examples of the various exemplary compositions and pH levels for each composition are set forth in Table I. In Table I, all amounts are given in weight percent and add up to 100 weight percent. The compositions disclosed herein were prepared by mixing the components together in a vessel at room temperature until all solids have dissolved. In the examples below, pH determinations were made using 5% aqueous solutions at ambient temperature. The substrates were coated with a positive resist that was developed, etched and ashed prior to exposure to the composition. In the following tables, "n/t" indicates not tested and "NC" indicates not compatible.

The summary of metal etch rates ("ER") for each exemplary composition having various metal layers are provided in Table II. In all of the following etch rates, measurements were conducted at 5, 10, 20, 40, and 60 minutes of exposure at the temperature provided in Table II. Thickness measurements were determined at each time interval and graphed using a "least squares fit" linear regression model on the results for each exemplary composition. The calculated slope of the "least squares fit" model of each composition is the resultant etch rate provided in angstroms/minute ($\in$/min). In determining the metal etch rate, the wafers had a blanket layer of a known thickness of a particular metal or metal alloy deposited upon it. The initial thickness of the wafer was determined using the CDE ResMap 273 Four Point Probe. After determining the initial thickness, test wafers were immersed in the exemplary compositions. After each time interval, the test wafers were removed from the exemplary composition, rinsed for three minutes with deionized water and completely dried under nitrogen. The thickness of each wafer was measured, and if necessary, the procedure was repeated at the next time interval. If the metal to be tested was titanium, an initial dip in phosphoric acid was required.

The summary of oxide etch rates ("ER") for each exemplary composition having various oxide layers are provided in Table III. Oxide etch rates were determined using a Nanospec AFT 181 or SENTECH SE-800 spectroscopic ellipsometer. A quantity of 200 ml of the exemplary composition was placed in a 250 ml beaker with stirring and heated, if required, to the specified temperature. For those tests run on the Nanospec AFT 181, three circles were scribed on each of the wafers to be tested. The marked areas on each wafer were the areas in which measurements would be taken. Initial measurements of each wafer were taken. After the initial measurements, the wafers were immersed in the exemplary composition for five minutes. If only one wafer was placed in a beaker containing solution a dummy wafer was placed in the beaker. After five minutes, the test wafer was washed with deionized water for three minutes, and dried under nitrogen. Measurements of the scribed areas on each wafer were taken and if necessary the procedure was repeated at the next time interval.

The summary of typical low-dielectric rates ("ER") for each exemplary composition having various low-k layers are provided in Table IV. The low-k dielectric etch rates were performed using silicon wafer having various low-k organosilicate films deposited thereupon. The low-k etch rates were obtained on an ellipsometer that was operated in the same manner as the Nanospec AFT or SENTECH described above for obtaining oxide etch rates.

Various test wafers that were exposed to exemplary compositions 3 and 4 and evaluated using scanning electron microscopy (SEM) in a variety of locations to determine the extent of etch and ash removal and the effect on the underlying substrate. The wafers were cleaved to provide an edge then examined using SEM on a variety of pre-determined locations on the wafer and the results were visually interpreted and coded as provided in the following manner: "+++" indicates excellent; "++" indicates good; "+" indicates fair; and "−" indicates poor. After exposure to the exemplary composition 3 or 4, the wafer(s) were rinsed with deionized water and dried with nitrogen gas. The results are provided in Table V. All of the results in Table V illustrate that exemplary compositions 3 and 4 removed etch and ash residues with substantially no attack to the underlying layer.

TABLE I

| | Example 1 | | Example 2 | | Example 3 | | Example 4 | |
|---|---|---|---|---|---|---|---|---|
| | d-PGME | 61 | t-PGME | 8.57 | GE | 45.0 | GE | 34.00 |
| | PG | 21.5 | | | Glycerol | 18.75 | PG | 12.00 |
| | DI Water | 12 | DI Water | 76.92 | DI Water | 31.65 | DI Water | 40.5 |
| | AF (40% Solution) | 3.0 | TMAF | 0.5 | AF (40% solution) | 1.00 | AF (40% solution) | 2.5 |
| | BZT (COBRA-TEC™ 99) | 2 | TMAH | 8.66 | DEHA | 1.8 | DEHA | 9.0 |
| | SURFY-NOL™ 485 surfactant | 0.5 | COBRA-TEC™ 948 | 5.35 | Lactic Acid (88% Aq. Solution) | 1.8 | Lactic Acid (88% Aq. Solution) | 2.0 |
| | pH | 4.90 | pH | ~12 | pH | 5.0 | pH | 6.25 | d-PGME  dipropylene glycol methyl ether
t-PGME  tripropylene glycol methyl ether
PG      propylene glycol
BZT     benzotriazole
TMAF    tetramethylammonium fluoride
TMAH    tetramethylammonium hydroxide
AF      ammonium fluoride
GE      glycol ether

TABLE II

Etch Rates on Typical Metals in Angstroms per minute (Å/min)

| Example | Temp. (°C.) | Al | Cu | Ta | TaN | Ti | TiN | TiW | W |
|---|---|---|---|---|---|---|---|---|---|
| Ex. 1 | 40 | 5 | <1 | <1 | <1 | 20 | 1 | <1 | <1 |
| Ex. 2 | 55 | NC | <1 | <1 | <1 | 1 | <1 | 9 | 3 |
| Ex. 3 | 25 | 19 | 2 | n/t | n/t | n/t | n/t | n/t | n/t |
| Ex. 4 | 25 | 6 | 2 | <1 | <1 | <1 | <1 | <1 | <1 |
| Ex. 4 | 40 | 7 | 1 | <1 | n/t | 15 | n/t | n/t | <1 |

TABLE III

Etch Rates on Typical Oxides in Angstroms per minute (Å/min)

| Example | Temp. (°C.) | FSG (1) | PTEOS (2) | TEOS (D) (3) | TOx (4) |
|---|---|---|---|---|---|
| Ex. 1 | 40 | 71 | 73 | 49 | 30 |
| Ex. 2 | 55 | <1 | 3 | <1 | <1 |
| Ex. 4 | 25 | 1 | n/t | n/t | <1 |
| Ex. 4 | 40 | n/t | 1 | 1 | n/t |

(1) Fluorosilicate glass (FSG)
(2) Phosphorous-doped undensified TEOS (tetraethyl ortho silicate)
(3) Undoped, densified TEOS
(4) Thermal Oxide

TABLE IV

Etch Rates on Typical Low-k dielectrics in Angstroms per minute (Å/min)

| | Temp (°C.) | BLACK DIAMOND® | CORAL® | DEMS® | Dense SiLK-D™ | Porous SiLK-D™ | ORION® | Porous DEMS® |
|---|---|---|---|---|---|---|---|---|
| Ex. 1 | 40 | 4 | <1 | 1 | <1 | >200 | 3 | >500 |
| Ex. 2 | 55 | <1 | 6 | 1 | 1 | <1 | <1 | 4 |
| Ex. 4 | 25 | n/t | <1 | 2 | 1 | <1 | <1 | 1 |

DEMS® low-k dielectric is a registered trademark of Air Products and Chemicals, Inc.;
BLACK DIAMOND® low-k dielectric is registered trademark of Applied Materials, Inc.;
CORAL® low-k dielectric is a registered trademark of Green, Tweed;
ORION® low-k dielectric is a registered trademark of Trikon Technologies;
SiLK® semiconductor dielectric resin is the Dow Chemical Company.

TABLE V

| | Layers Cu/low-k | Temp. (°C.) | Time (min.) | Etched and Ashed Photoresist Residue | Cu attack |
|---|---|---|---|---|---|
| Ex. 3 | TEOS/CORAL® | 27 | 3 | +++ | No |
| Ex. 4 | JSR LKD-5109 low-k dielectric | 27 | 5 | +++ | No |
| Ex. 4 | JSR LKD-5109 low-k dielectric | 25 | 10 | +++ | No |

The invention claimed is:

1. A composition for removing residues from an article, the composition comprising:
  50% by weight or greater of at least one water soluble organic solvent comprising a glycol ether and at least one alcohol selected from a polyhydric alcohol, tetrahydrofurfuryl alcohol, and combinations thereof;
  water;
  0.1% by weight or greater of an added fluoride containing compound provided that if the fluoride containing compound is ammonium fluoride no additional fluoride containing compound is added to the composition; and
  optionally a quaternary ammonium compound.

2. The composition of claim 1 further comprising a corrosion inhibitor.

3. The composition of claim 2 wherein the corrosion inhibitor comprises at least one selected from an organic acid, an organic acid salt, catechol, resorcinol, a phenol, maleic anhydride, phthalic anhydride, catechol, pyrogallol, gallic acid or esters thereof, benzotriazole, carboxybenzotriazole, a hydroxylamine, fructose, ammonium thiosulfate, glycine, tetramethylguanidine, iminodiacetic acid, dimethylacetoacetamide, trihydroxybenzene, dihydroxybenzene, salicyclohydroxamic, thioglycerol, and mixtures thereof.

4. The composition of claim 3 where the corrosion inhibitor comprises the hydroxylamine.

5. The composition of claim 4 wherein said hydroxylamine comprises diethyl hydroxylamine.

6. The composition of claim 1 wherein the glycol ether is selected from the group consisting of ethylene glycol monomethyl ether, ethylene glycol monoethyl ether, ethylene glycol monobutyl ether, ethylene glycol dimethyl ether, ethylene glycol diethyl ether, diethylene glycol monomethyl ether, diethylene glycol monoethyl ether, diethylene glycol monopropyl ether, diethylene glycol monoisopropyl ether, diethylene glycol monobutyl ether, diethylene glycol monoisobutyl ether, diethylene glycol monobenzyl ether, diethylene glycol dimethyl ether, diethylene glycol diethyl ether, triethylene glycol monomethyl ether, triethylene glycol dimethyl ether, polyethylene glycol monomethyl ether, diethylene glycol methyl ethyl ether, triethylene glycol ethylene glycol monomethyl ether acetate, ethylene glycol monoethyl ether acetate, ethylene glycol monomethyl ether acetate, dipropylene glycol methyl ether, tripropylene glycol methyl ether, propylene glycol monomethyl ether, propylene glycol dimethyl ether, propylene glycol monobutyl ether, propylene glycol, monoproply ether, dipropylene glycol monomethyl ether, dipropylene glycol monopropyl ether, dipropylene glycol monoisopropyl ether, dipropylene monobutyl ether, dipropylene glycol diisopropyl ether, tripropylene glycol monomethyl ether, 1-methoxy-2-butanol, 2-methoxy-1-butanol, 2-methoxy-2-methylbutanol, 1,1-dimethoxyethane, and 2-(2-butoxyethoxy)ethanol.

7. The composition of claim 1 wherein the water soluble organic solvent further comprises one selected from the group consisting of dimethylacetamide, N-methylpyrrolidinone, dimethylsulfoxide, dimethylformamide, N-methylformamide, formamide, dimethyl-2-piperidone, tetrahydrofurfuryl alcohol, an alkanolamine, glycerol, and mixtures thereof.

8. The composition of claim 1 wherein the fluoride containing compound comprises a compound having a general formula $R_1,R_2,R_3,R_4NF$ where $R_1$, $R_2$, $R_3$ and $R_4$ are independently hydrogen, an alcohol group, an alkoxy group, an alkyl group and mixtures thereof.

9. The composition of claim 8 wherein the fluoride containing compound is selected from tetramethyl ammonium fluoride, tetraethyl ammonium fluoride, tetrabutyl ammonium fluoride, choline fluoride, and mixtures thereof.

10. The composition of claim 1 wherein the fluoride containing compound comprises fluoroboric acid.

11. The composition of claim 1 wherein the composition comprises a quaternary ammonium compound.

12. The composition of claim 11 wherein the quaternary ammonium compound is selected from the group consisting of tetramethylammounium hydroxide, tetraethylammonium hydroxide, tetrapropylammonium hydroxide, tetrabutylammonium hydroxide, trimethylethylammonium hydroxide, (2-hydroxyethyl)trimethylammonium hydroxide, (2-hydroxyethyl)triethylammonium hydroxide, (2-hydroxyethyl) tripropylammonium hydroxide, (1-hydroxypropyl)trimethylammonium hydroxide, and mixtures thereof.

13. A method for defining a pattern wherein comprises coating a photoresist onto a substrate,
lithographically defining a pattern on the photoresist;
transferring the pattern to the substrate;
removing photoresist or etching residue or both from the substrate by contacting the substrate with a composition that comprises: a water soluble organic solvent comprising 50% by weight or greater of at least one water soluble organic solvent comprising a glycol ether and at least one alcohol selected from a polyhydric alcohol, tetrahydrofurfuryl alcohol, and combinations thereof;
water;
0.1% by weight or greater of an added fluoride containing compound provided that if the fluoride containing compound is ammonium fluoride no additional fluoride containing compound is added to the composition; and
optionally a quaternary ammonium compound.

14. The method of claim 13 wherein the photoresist is a positive photoresist.

15. The method of claim 13 wherein the photoresist is a negative photoresist.

16. A composition for removing residues from an article, the composition comprising:
50% by weight or greater of at least one water soluble organic solvent comprising a glycol ether and at least one alcohol selected from a polyhydric alcohol, tetrahydrofurfuryl alcohol, and combinations thereof;
less than 50% by weight of water;
up to 20% by weight of a fluoride containing compound provided that if the fluoride containing compound is ammonium fluoride no additional fluoride containing compound is added to the composition; and
up to 20% by weight of a corrosion inhibitor wherein the composition has a pH ranging from about 4 to about 7.

17. A composition for removing residues from an article, the composition comprising:
50% by weight or greater of water;
less than 50% by weight of at least one water soluble organic solvent comprising a glycol ether and at least one alcohol selected from a polyhydric alcohol, a glycol, tetrahydrofurfuryl alcohol, and combinations thereof;
0.1% to 20% by weight of an added fluoride containing compound provided that if the fluoride containing compound is ammonium fluoride no additional fluoride containing compound is added to the composition; and
up to 20% by weight of a corrosion inhibitor wherein the composition has a pH ranging from about 7 to about 14.

18. The composition of claim 1 wherein the at least one alcohol is the polyhydric alcohol.

19. The composition of claim 18 wherein the polyhydric alcohol is selected from ethylene glycol, propylene glycol, glycerol, and combinations thereof.

20. The composition of claim 16 wherein the at least one alcohol is the polyhydric alcohol.

21. The composition of claim 20 wherein the polyhydric alcohol is selected from ethylene glycol, propylene glycol, glycerol, and combinations thereof.

* * * * *